United States Patent [19]
Dierker et al.

[11] 4,059,798
[45] Nov. 22, 1977

[54] METHOD AND APPARATUS FOR MEASURING THE CURRENT FLOWING IN A WORKPIECE

[75] Inventors: Jeffrey A. Dierker, Westerville; Prentice G. Moore, Columbus, both of Ohio

[73] Assignee: F. W. Bell, Inc., Columbus, Ohio

[21] Appl. No.: 664,716

[22] Filed: Mar. 8, 1976

[51] Int. Cl.² ............................................. G01R 33/00
[52] U.S. Cl. .................................... 324/127; 324/251; 324/117 H; 324/225
[58] Field of Search .......................... 324/45, 117, 127

[56] References Cited
U.S. PATENT DOCUMENTS

| | | | |
|---|---|---|---|
| 3,482,163 | 12/1969 | Peek et al. | 324/45 |
| 3,706,032 | 12/1972 | Vikstrom | 324/117 R |

Primary Examiner—Robert J. Corcoran
Attorney, Agent, or Firm—Vincent G. Gioia; Robert F. Dropkin

[57] ABSTRACT

Magnetic cores of clamp-on type current measuring devices having a Hall-effect device for measurement of D.C. currents are provided with stabilizing coils which are periodically energized to substantially eliminate the characteristic hysteresis effect of the core material. A magnetic core of the type which is split to permit opening and subsequent clamping onto a conductor, has one section thereof provided with an air gap in which the Hall-effect device is positioned. A stabilizing coil is positioned on one section of the magnetic core and the coil and is periodically energized with a damped oscillatory current. This damped oscillatory current is at least applied immediately prior to the taking of any current measurement and is preferably applied periodically to maintain the stability of the magnetic core.

5 Claims, 13 Drawing Figures

METHOD AND APPARATUS FOR MEASURING THE CURRENT FLOWING IN A WORKPIECE

BACKGROUND OF THE INVENTION

Clamp-on type probes have been developed and heretofor utilized in electrical current measurement apparatus. These devices are designed to permit positioning of the probe onto a current carrying conductor and thereby avoid disturbance of the conductor itself, such as that required by cutting and inserting a shunt or other precise current measuring devices. The clamp-on type probes of the prior art generally comprise two C-shaped sections of laminated sheets of metal that are designed to have the desired magnetic characteristics. Each of the C-shaped sections is supported in a structure which may be fabricated from a non-magnetic material that is configured as a pliers or scissors to permit relative movement of the two core sections for opening and closing of the abutting ends of the two sections. In the current measuring probes of the type with which this invention is concerned, a Hall-effect device is often utilized as the magnetic field sensing element. This Hall-effect device, in accordance with the prior art, is often positioned at an end-face of one of the C-shaped core sections and the necessary electrical conductors for applying the driving current and detecting the resultant Hall-effect generated voltage are extended from the device and along the core through the supporting structure to an appropriate voltage measuring instrument. The voltage measuring instrument is usually provided with an indicating meter which provides a relative indication of the current carried by a conductor that extends through the magnetic core of the probe.

A substantial disadvantage and defect of the prior art magnetic core construction for such clamp-on probes has been the inability of these devices to compensate for or eliminate the hysteresis effect of magnetic materials. Since the object of such measuring devices is to determine or ascertain the current carried by a conductor at a particular instant, it is apparent that the current being measured will probably change over a period of time. The relationship of this current change to the measured indication is affected by the hysteresis characteristic of the magnetic core material and reduces the accuracy of the indication of the current that is carried by a conductor. As a consequence of the hysteresis effect, there will be a difference in the current indicated by the instrument for a same specific current carried by the conductor depending on whether the current has increased from a previously measured point or has decreased from a previously measured point. This difference is a function of the hysteresis characteristics of the particular magnetic core material.

In an attempt to eliminate or at least minimize the hysteresis effect, prior art devices have utilized magnetic materials which are designed to have a more idealized hysteresis characteristic. That is, materials for the core are designed or selected to have the hysteresis envelope reduced to a minimum and thereby attempt to reduce the errors introduced as a consequence of changing magnetic fields such as are produced by an increase or decrease in measured current. This technique of selecting specifically magnetic materials has been moderately effective where the hysteresis characteristics become more idealized but the effect remains and does produce an error in the current measurements. It will also be apparent that selection of specific magnetic materials having the desired magnetic characteristic results in an added expense which substantially increases the cost of the current measuring equipment.

Although selection of magnetic materials having the most advantageous hysteresis characteristics is effective to a degree in minimizing the error introduced by hysteresis, this material selection technique has introduced a disadvantage in the construction of clamp-on devices. This advantage is that these specifically selected materials generally are of a type having a relatively high magnetic permeability which become saturated at relatively low driving current levels. This characteristic is a disadvantage where substantially large currents are to be measured, such as in the order 500 amperes or more, as it is necessary that the apparatus be operated only in the region where the magnetic core is unsaturated or below the region of the knee of the magnetization curve. Consequently, in order to permit use of the prior art devices utilizing the relatively expensive, high permeability magnetic materials, it becomes necessary to introduce substantial air gaps in the magnetic core circuit to increase the reluctance of the magnetic circuit and enable operation in the linear range of the magnetization curve. Artificial increasing of the magnetic reluctance, however, introduces a further disadvantageous effect in that the magnetic fields have a tendency to then follow air leakage paths. The magnetic field in the gap is thus decreased substantially, resulting in reduced Hall-effect generated output (for the same current input). To overcome the reduced gain of the Hall-effect device and magnetic circuit combination, higher electronic gain is required. Relying on the electronics for increased signal level has the disadvantage of making the total system more susceptible to temperature drift, internally generated noise and radio frequency interference. Also, the current probe useability at low level currents is much reduced, if not eliminated completely. Another undesired result of using large gaps to reduce flux density is a greater susceptibility to external or extraneous magnetic field interference. This interference is manifested as external noise and can be generated by conductors outside the aperture or by ferrous metal near the current probe.

SUMMARY OF THE INVENTION

In accordance with this invention, the magnetic core of the clamp-on type probe for current measuring device is provided with a stabilizing coil, which has as its objective, enabling utilization of more commonly available and less costly magnetic materials for the magnetic core. While these materials have hysteresis effects that are substantially more disadvantageous than those for the more expensive special alloyed materials, the stabilizing coil more than adequately compensate for the hysteresis effect. Although primarily designed to permit utilization of the less expensive magnetic core materials, the stabilizing coil and stabilizing techniques of this invention can also be utilized to a substantial advantage with the more expensive core materials having a hysteresis characteristic that more nearly approximates the idealized magnetization characteristic.

Stabilization of a magnetic core in accordance with this invention is defined as causing or resulting in the core effectively operating on an essentially idealized magnetization characteristic. The function of the stabilizing coil which is periodically energized with a damped, oscillatory-waveform current is to effectively stabilize the magnetic core at any particular current-induced magnetic field to an effective median of the hysteresis loop which closely approximates the ideal magnetization curve. Application of a damped oscillatory-waveform current to effectively eliminate the hysteresis effect produces the advantageous repeatability of accurate current measurements at any given value of current. A further advantage of this stabilization is that the apparatus may be electrically set at zero for more accurate measurements of low magnitude currents.

A further distinct advantage of utilizing stabilization in accordance with teaching of this invention is that the magnetic materials having a inherently higher saturation point may be utilized for the current probe. The advantage of utilizing magnetic materials having a relatively high saturation level is that any specific instrument utilizing such a probe will be capable of relatively wide-range current measurements. Another inherent advantage of utilizing such materials is that the core need not be fabricated with large air gaps to increase the magnetic reluctance and thereby achieve this same result. As previously indicated, the disadvantage of increasing the length of an air gap is that there is an increased tendency for the magnetic field to follow leakage air paths rather than travel through the gap where the field can be sensed by the Hall-effect device.

Also, in accordance with this invention, the Hall-effect device is most advantageously positioned in a precisely controlled air gap formed in one of the C-shaped sections of the magnetic core. This air gap is relatively small and is precisely controlled thereby maintaining uniformity in measurements and effectively minimizes air path leakage. The disadvantage of positioning the Hall-effect device at the end face of one of the C-shaped sections is that the air gap condition is frequently changed as the clamp is closed around a conductor. Consequently, construction of the core and positioning of the Hall-effect device in accordance with this invention eliminates the effect and dependence on the closing of the two C-shaped sections of the core.

These and other objects and advantages of this invention will be readily apparent from the following detailed description of the embodiment thereof and the accompanying drawings illustrating that embodiment and operational characteristics.

DETAILED DESCRIPTION OF THE ILLUSTRATIVE EMBODIMENT

Figure 1:
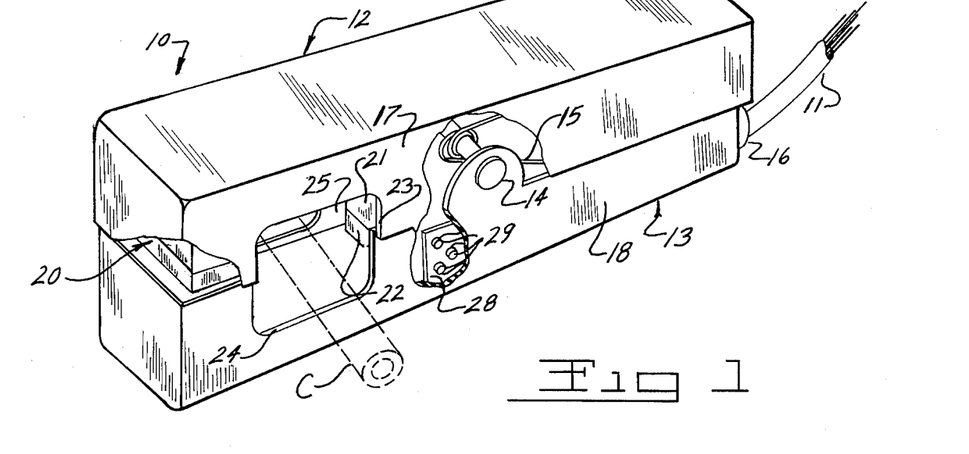
FIG. 1 is a perspective view of the typical clamp-on type probe utilized in current measurement instrumentation.

Having reference specifically to FIG. 1 of the drawings, a clamp-on type probe 10 typical of such probes utilized with electric current measurement instrumentation is illustrated to provide a background for the invention. The mechanics of construction are shown in FIG. 1 with electrical interconnection to typical electrical instrumentation being shown in FIG. 5. A single multi-conductor cable 11 is shown in FIG. 1 to indicate the electrical connection with the associated instrumentation. While a clamp-on type probe is illustrated and described, it will be apparent and understood that this invention is equally applicable to permanent or fixed-mounting current sensor instrumentation.

Forming the probe are two housing sections 12 and 13 of elongated channel form. The ends of each section are closed with one longitudinal side being open. The two sections 12 and 13 are pivotly interconnected at approximately midpoint by a pivot pin 14. A torsion spring 15 carried by the pivot pin 14 interiorly of the two housing sections cooperatively interengages with the sections to effectively separate the ends at which the cable 11 enters thereby applying a clamping force between the opposite end portions. The one housing section 13 is of a relatively narrower width than the opposite section 12 and thus interfits therewith to form a relatively closed structure for improved appearance as well as assuring relatively complete protective enclosure of the internal components. A suitable strain relief connector 16 for the cable 11 is mounted in the one end of the housing section 13 and secures the cable to prevent abrasion and mechanical damage thereto. Each of the housing sections 12 and 13 has longitudinal side walls 17 and 18.

A two section magnetic core 30 is mounted in housing sections 12 and 13 opposite the end at which the cable 11 enters. These housing sections 12 and 13 may be fabricated from a material which is non-magnetic and does not form a low-reluctance, magnetic flux path which may interfere with or affect the operation of the magnetic core itself. A suitable high impact strength synthetic resin material may be advantageously utilized for fabrication of the housing sections. Although the housing sections are indicated as being formed from a non-magnetic material, magnetic materials may be utilized to provide shielding with respect to external magnetic fields by giving approximate consideration to maintenance of a high reluctance path between the housing or shield and the core.

The magnetic core 20, which is formed as a rectangularly shaped closed loop as will be explained in greater detail hereinafter, is fabricated in two sections 21 and 22 that are mounted in the respective housing sections 12 and 13. The two sections are effectively C-shaped having end-poles adapted to meet and thus effect a closed magnetic path when the clamp is secured onto a electric current carrying conductor. Mounting of the two core sections 21 and 22 may be conveniently affected by adhesively securing the core sections in the respective housings and the associated core sections, 21 or 22.

Each of the housing sections 12 and 13 is configured to form an enlarged aperture in the region of the central area of the magnetic core to permit passage therethrough of the electric current carrying conductor. Such a conductor is shown in broken lines and designated by the letter C in FIG. 1. Each of the side walls 17 and 18 of the respective housing sections 12 and 13 are thus provided with the respective notches 23 and 24 that cooperatively defined a relatively large opening or aperture 25 to receive conductors of varying sizes up to the maximum size that may be accommodated by the particular magnetic core 20. By designing the notches 23 and 24 to have the respective peripheral edges thereof spaced a distance slightly inward from the inner surfaces of the magnetic core results in a protective structure for the core. The edges of the notches will thus contact the conductor and prevent abrasion of the magnetic core.

A terminal or connector board 28 is preferably mounted in the interior of the one housing section 13 and the several conductors of cable 11 are secured to respective terminal pins 29 thereof. Interconnection with the components of the magnet core are then readily accomplished by appropriate interconnection with the respective terminal pins.

Operation of this type of probe is readily apparent. The operator merely compresses together the ends of the housing 12 and 13 adjacent the cable 11 to open the opposite end and admit or release a conductor C. Release of pressure by the operator will permit the torsion spring 15 to again close the housing section ends in which the magnetic core is mounted. This will close and secure a conductor C in the aperture 25 defined by the notches 23 and 24.

Figure 2:
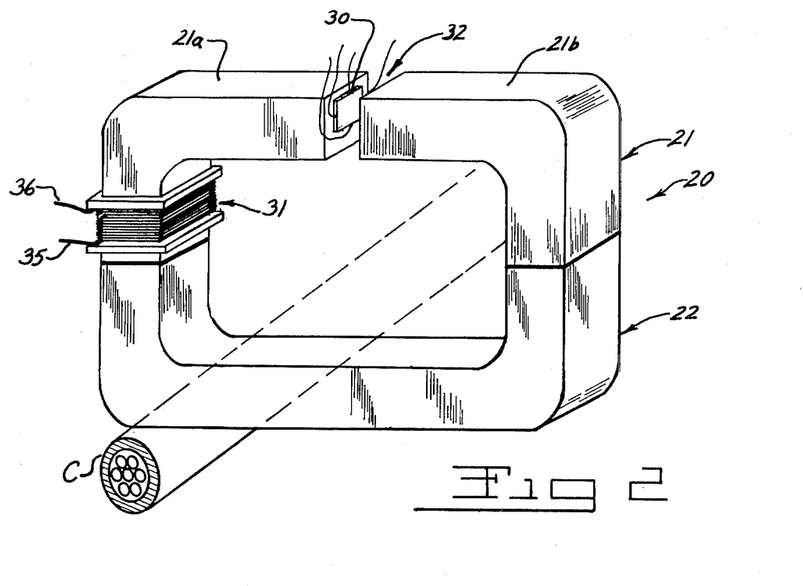
FIG. 2 is an enlarged perspective view of the magnetic core of this probe provided with a stabilizing coil.

The structural configuration of the magnetic core 20 as well as its relationship to a Hall-effect element 30 and stabilizing coil 31 is best seen in FIG. 2. In that Figure, the magnetic core 20 is shown comprising two C-shaped sections 21 and 22 disposed in relatively closed relationship to form the rectangular shape and closed magnetic path. The one core section 21 comprises two similar sections or components 21a and 21b which are supported in cooperative relationship to define the C-shaped element. The other section 22 is formed as a single-piece, matching C shaped section. Both of the sections 21 and 22 have opposed end faces which are adapted to interengage and contact each other when the probe 10 is clamped onto a conductor. With this arrangement, the two sections 21 and 22 do not have a gap formed between the end faces of the two sections of the core when the probe is in clamped relationship to a conductor. The two portions 21a and 21b of the one section 21 are separated at approximately the mid-point by a relatively narrow air gap 32. In this air gap 32 is positioned the Hall-effect element 30 which is cemented to the face of section 21a forming one side of the air gap and the several electrical conductors connected thereto are then extended outwardly around the outer periphery of the magnetic core and secured to the respective pins 29 on terminal mounting board 28.

Also positioned onto one leg of the core section 21a is the stabilizing coil 31. This stabilizing coil is wound on a plastic bobbin 33 and includes a predetermined number of turns of wire 34 necessary to produce a stabilizing magnetic field. The ends of the wire 34 forming the stabilizing coil are connected by the respective leads 35 and 36 to respective pin terminals 29 on the mounting board 28.

In order to better understand and comprehend the structural relationship of the several components of this probe, a description of typical dimensions of the magnet core shown in FIG. 2 is provided but it will be understood that this is an example of such a probe for measurement of currents in the range of a maximum of 600 amperes. A magnetic core 20 for such an instrument is essentially square in plan view having exterior dimensions of the order of 2 ½ inches. The cross-sectional dimensions of the core sections are of the order of one-half inch in each direction thereby resulting in an interior aperture of about 1 ½ inches in each direction for receiving the current carrying conductor. The air gap 32 formed in the core section 21 may be of the order of one-sixteenth of an inch for a probe capable of measuring a maximum of six hundred amperes. The probe, which for purposes of example in accordance with this invention, has a magnetic core fabricated from material that is designated in the trade as "Silectron". This is a grain-oriented cold-rolled steel which has alloy of 3% silicon. It will be understood that this air gap 32 may be increased or decreased in accordance with the specific characteristics of the material used in forming the core as well as the maximum current measuring requirements of the instrument. Also, while the magnetic core is preferably of a laminated construction, the core may be a solid structure.

As previously indicated, positioned within the air gap is the Hall-effect element 30. A typical element may have a dimension of one-tenth inch on each side and is 0.020 inches thick. This element may be conveniently cemented to the end face of one side face of the air-gap and is preferably centered on that face.

In this illustrated embodiment, the stabilizing coil 31 may comprise about 100 to 1,000 turns of number 30 magnet wire. This wire has been found adequate for the purposes of the stabilizing coil 31 in that the current that is required to be carried most likely will have a peak value of 200 milliamps. In the illustrated example of utilizing a silectron steel for the magnetic core, it has been the objective to provide a basis for realistic comparison of the capability for utilizing a relatively inexpensive core material while obtaining the required high-accuracy measurements. This silectron material, is compared with two other widely utilized core materials for current measuring probe instruments. One of these materials is identified by its conventional code designation of 4750 while the other material is identified as Molybdenum permalloy and carries a number identification of 4–79. The magnetic characteristics of the materials for purposes of comparison are that the silectron material saturates at a level of about 18,000 Gauss whereas the Molybdenum permalloy material will saturate at about 6,000 Gauss. The 4750 material is saturable at intermediate level approximating 10,000 Gauss. Again, it will be understood that these materials were selected for purposes of comparison and illustration and are not to be considered as limitative factors for constructing and utilizing a current measuring probe in accordance with the principals of this invention.

Figure 3:
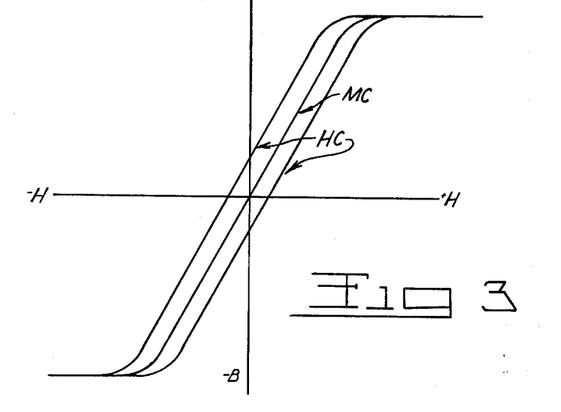
FIG. 3 is a graphical representation of an idealized magnetization curve and typical hysteresis characteristic.

Customarily, magnetic cores are fabricated from a number of thin sheets assembled in laminated relationship with the structure capable of being subsequently machined to the desired configuration. Such cores have magnetization characteristics MC and hysteresis characteristics HC of the typical configuration illustrated in FIG. 3. This diagram is illustrative and is not indicative of the particular characteristics for any specific material. As a magnetic field is induced in a core of typical magnetic material, the resultant flux density will be determined by the magnetization characteristic MC of the particular material having the typical configuration that is illustrated in FIG. 3. That is, as the magnetic field strength is increased, the flux density will also proportionately increase and follow the magnetization curve MC in accordance with the relative polarity of the field. As the core becomes saturated, the flux density will no longer increase with further increase in the magnetizing field. A decrease in the magnetic field does not result in a following of the magnetization curve MC because of residual magnetism and the flux density in a typical dynamic situation is more accurately determined by the hysteresis characteristics are relatively symmetrical in both quadrants.

Current measurements are normally obtained over a period of time in a particular situation where it is desired that the current be maintained at a predetermined value. Variations in the current from this desired or nominal current and associated magnetizing field produce a change in the flux density at this localized area. From a practical standpoint what occurs in utilization of probe type instruments for measurement of currents is that there will be a substantial difference in the measured flux density for a specified current or magnetizing field and depend on whether the current is increased or decreased at that particular moment of measurement. Since the core must function on the basis of hysteresis characteristic, this difference will produce a significant error in the sensed current that is indicated by the apparatus. This error results from the fact that the sensed flux density at a particular nominal current will be that as determined by minor hysteresis characteristics developed in accordance with increase or decrease of magnetic field or sensed current at the nominal point. Because of this hysteresis effect, an incremental change is current in one direction followed by a subsequent change equal in magnitude but opposite indirection will not result in the same output indication. It is this defect that is a characteristic of the known prior art probe-type current measurement apparatus and it is to elimination or effective minimization of this defect that this invention is directed. It will be shown that this invention is capable of effecting a significant improvement in the output indications that may be determined by probe-type instruments.

Figure 4:
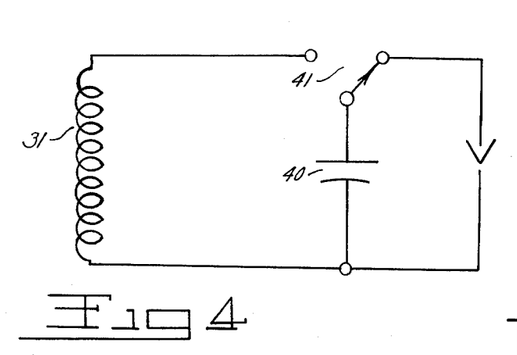
FIG. 4 is a schematic diagram of the electrical circuit for the stabilizing coil.
Figure 4A:
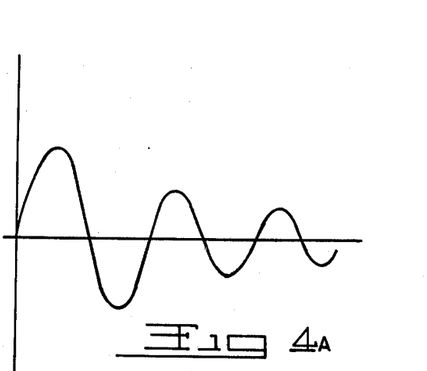
FIG. 4A is a damped oscillatory waveform produced by the circuit of FIG. 4.

As previously indicated, in accordance with this invention, a stabilizing coil 31 is mounted on the magnetic core 20 and is periodically energized by a damped oscillatory waveform current which induces a similar waveform magnetic field in the magnetic core and superimposd on the D.C. magnetic field induced by the current being measured. The periodic application of this stabilizing current will be described in substantial detail hereinafter, but, it will be noted that the circuitry for application of the stabilizing current is diagramatically illustrated in FIG. 4 in very basic form. This circuit includes the stabilizing coil 31 having its terminals connected to an energizing circuit advantageously includes a capacitor 40 which may be selectively connected to either the stabilizing coil 31 or a suitable voltage source V by means of a switching device 41. This switching device 41 is illustrated as a single-pole two position switch in which the pole may be connected to a terminal of either the voltage source V or a terminal of the stabilizing coil 31 and has the pole connected into circuit with the capacitor 40. For the previously described stabilizing coil 31, the voltage source V may be of a type which provides a D.C. current of the order of 100 miliamps 30 volts. Charging of the capacitor 40 is accomplished while the switching device 41 is positioned to connect the capacitor in circuit with the voltage source. Once the capacitor has been adequately charged, the stabilizing coil 31 may be energized as determined necessary through operation of the switch 41 for the practice of this invention in association with a probe provided having a magnetic core. This is accomplished by positioning the switch to connect the stabilizing coil in circuit with the capacitor and thus result in discharge of the capacitor. Discharge of the capacitor through the coil produces a damped oscillatory waveform current such as that is diagramatically shown in FIG. 4a. This oscillatory current may have a maximum magnitude of 200 milliamps and oscillates at a frequency of approximately 180 Hz with the current decaying to zero in approximately 15 milliseconds.

The stabilizing magnetic field induced by stabilizing coil 31 is applied concurrently with the field that is induced by the current carrying conductor which is being monitored by the probe. The effect of this application of the damped oscillatory magnetic field superimposed on an essentially direct-current or steady state magnetic field is that the hysteresis effect on the magnetic field being increased or decreased will be eliminated from detection by the apparatus. In effect, the stabilizing coil through periodic operation will make the magnetic core function as though it had essentially no hysteresis effect whatsoever. Accordingly, the core operates throughout the measurement range on an essentially idealized magnetization characteristic MC, as indicated in FIG. 3, and not on the hysteresis characteristic HC.

Figure 6:
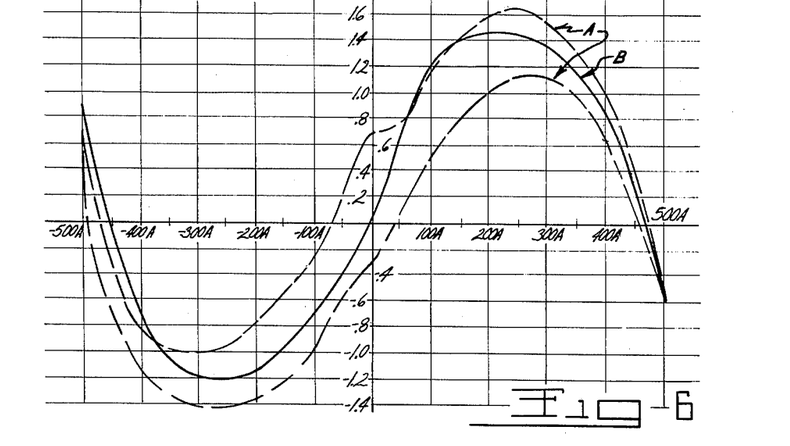
FIGS. 6, 7 and 8 are graphical representations of operational characteristics of a magnetic core for a probe of this invention operated over three respective current ranges, and utilizing a low quality magnetic material.

The advantageous result obtained through the use of the stabilizing coil and applying the stabilizing procedure to the magnetic core is graphically illustrated in FIG. 6. FIG. 6 is a representation of the stabilized and unstabilized operating characteristic of a typical material such as the Silectron. This graphical representation compares the accurately measured current as determined from a shunt type instrument with current measured by a clamp-on probe with the comparison represented as percent error of full scale of the accurate shunt measured current. Considering first the unstabilized characteristic A, it will be noted that as the current increases in a positive direction that a specific error characteristic is developed. In obtaining data for the graphs, the current through the conductor was first incrementally increased and then incrementally decreased to obtain the data in both positive and negative current ranges. Discontinuities are apparent in the zero region as a consequence of reconnecting the circuit for positive and negative and this would not be apparent in an operational circuit. Subsequently, decrease of this current from its maximum valve which in this instance of the order of 500 amps resulted in operation in the near saturated range, produced the percent error that is relatively higher than that noted during the increase of a current. This same characteristic is generally developed as the current is increased in a negative direction and then subsequently decreased to zero. In effect, an error envelope is developed to illustrate this characteristic and is produced by the hysteresis effect of the particular material for the core. This dramatically demonstrates that an unstabilized magnet core can not produce repeatable results for a specific current as a consequence of the hysteresis effect.

In direct contrast, it will be seen from the curve designated B which represents the results obtained with the effect of stabilization that excellent repeatability is obtained for measurements throughout the indicated current range. From this graphical representation, it will be seen that the error remains the same regardless of whether the current is increasing or decreasing or whether the measurements were taken in the positive or negative range. Consequently, the probe can be calibrated to produce accurate results that are repeatable with dependability throughout the entire operating range of the instrument. A further advantage will be observed by reference to FIG. 6 in that relatively accurate measurements are obtainable over an extremely large current range which in this instance is of the order of 1,000 amperes total (−500 to +500). It will be particularly noted that highly accurate results are obtained in the lower current ranges as the percent error is based on full scale (500 amps).

Figure 7:
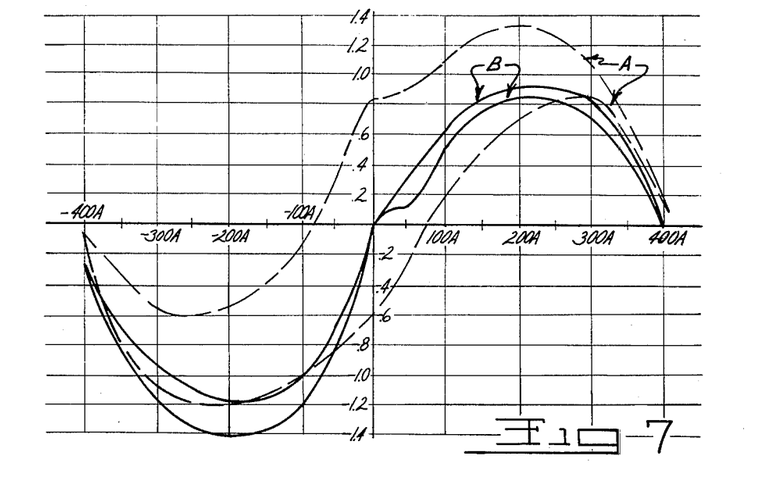
Figure 8:
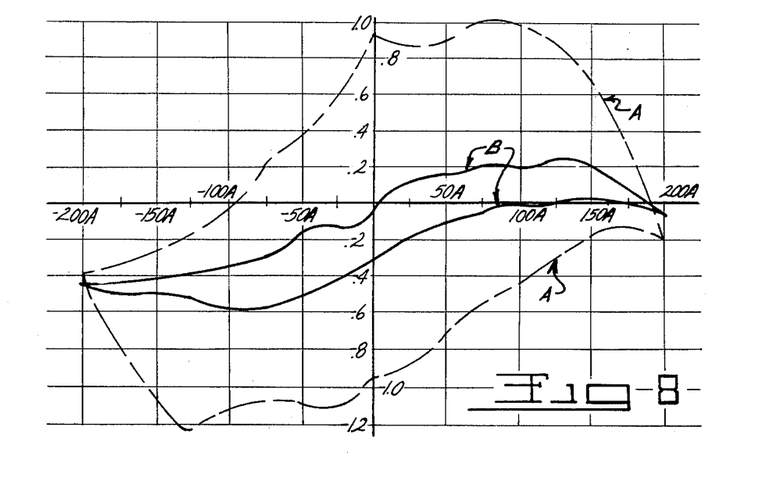

Test results were also obtained for the Silectron material where the current range was diminished to avoid having any possibility of operation within or near the saturated range. FIG. 7 is a graphical representation of data obtained where the maximum current measured was 400 amps, both positive and negative. Again, the obvious advantage of stabilization is clearly evident in the very close comparisons of indications for an increase or decrease in current. As between a stabilized B and an unstabilized A measurement situation, the error induced in an unstabilized situation with this material is unacceptable for most measurement circumstances. This clearly obvious advantage of stabilization is further demonstrated in FIG. 8 where the maximum current measurement in either direction was 200 amperes. When the core is not subjected to the stabilization procedure of this invention, it will be seen that the measurements result in errors which are grossly unacceptable and essentially nonexistent repeatability.

Figure 9:
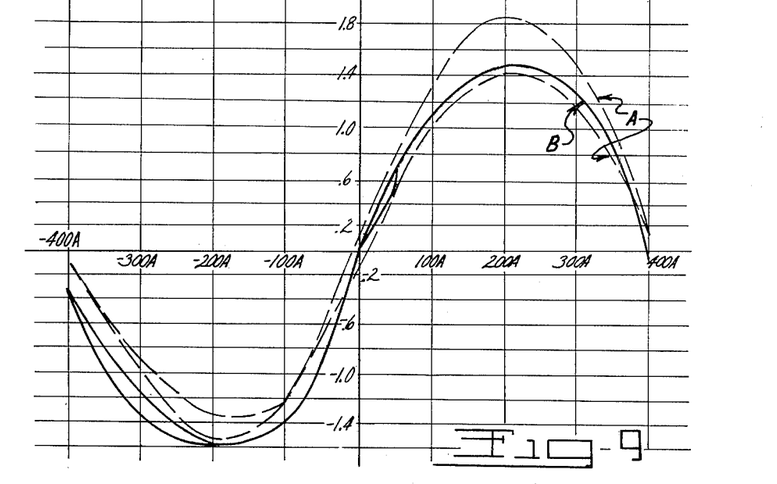
FIGS. 9, 10 and 11 are similar graphical representations of operational characteristics for a more expensive material as determined over three current ranges.
Figure 10:
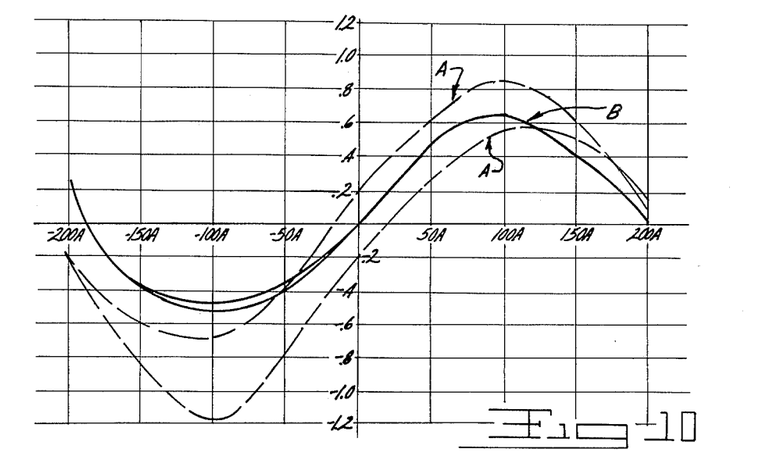
Figure 11:
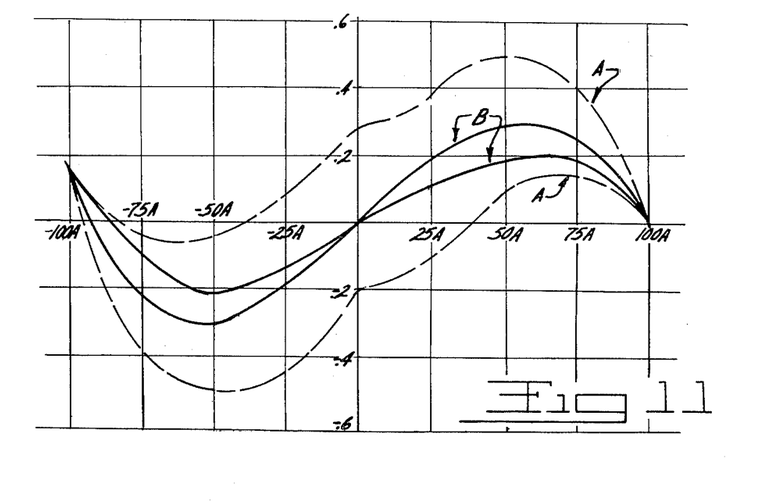

The same type of tests were also applied to a magnetic core which is fabricated from the 4750 material. These tests were conducted at three different current ranges, specifically a maximum of 400 and at 200 and 100 amps. In each instance, it will be clearly evident that the stabilization procedure is also capable of effecting a substantial improvement in operation of a magnetic core fabricated from this material for each of the three current ranges. Furthermore a comparison of the FIGS. 9 and 10 curves with FIGS. 7 and 8 for the same current ranges with respect to the Silectron material will clearly indicate that the Silectron material is capable of performing equally well, if not better than the higher priced and more expensive 4750 material when considering the additional factor that the Silectron material has a higher saturation level.

Figure 12:
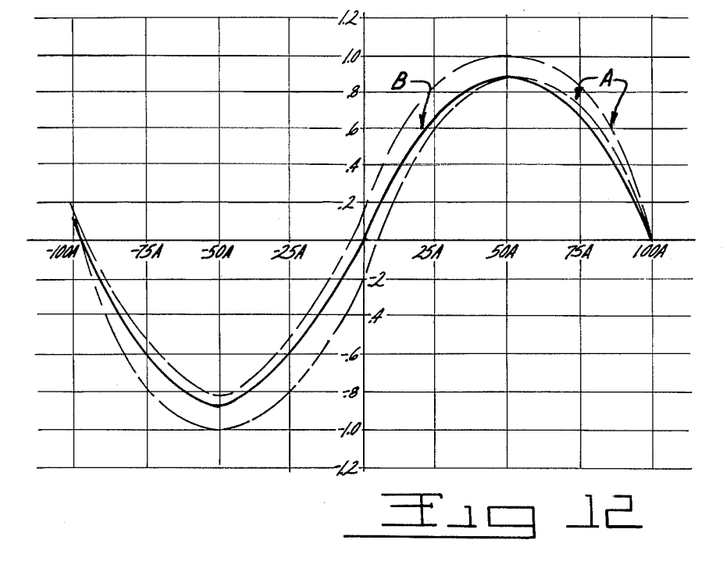
FIG. 12 is a graphical representation of an operational characteristic for a second expensive core material for a single current range.

Similarly, the same type of tests were performed on a magnetic core which is fabricated from a Molybdenum Permalloy material. The results for a magnetic core of this material are graphically represented in FIG. 12. Again the stabilization techniques result in a marked improvement in the performance of this material, a material which is designed to produce highly accurate results in normal operating condition. However, reference to FIG. 12 will show that the material when operated unstabilized inherently produces errors as a consequence of the hysteresis effect.

Figure 5:
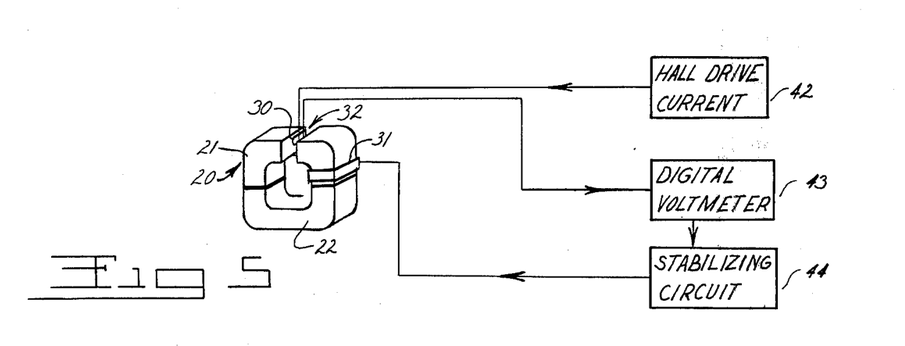
FIG. 5 is a schematic diagram of a magnetic core of this invention, interconnected with a complete operational circuit.

A more complete circuit for utilization of a magnetic core in performance of current measurements where the sensing device is a Hall-effect element mounted in a clamp-on type probe is shown diagrammatically in FIG. 5. As can be seen by reference to that figure, the components of the magnetic core, which include the Hall-effect element 30 and stabilizing coil 31, are shown connected to these various components of the associated instrumentation. This instrumentation includes a circuit 42 providing the constant Hall-drive current for functioning of the Hall-effect element. The output voltage terminals of the Hall-effect element are connected to a digital volt meter 43 which provides the output indication as well as a timing signal for the operation of the stabilizing circuit 44. This interconnection is shown in FIG. 5 with the timing signal connections being shown by the interconnections between the volt meter and the stabilizing circuit. In this circuit it will be understood that the stabilizing circuit 44 utilizes an electronic switching device 41 which automatically functions to recharge the capacitor 40 in the illustrated and exemplary stabilizing circuit. It will be understood that other well-known circuits may be utilized to produce the necessary damped oscillatory waveform stabilizing current.

A digital volt meter of the type customarily utilized for instrumentation of this type operates with a measuring cycle wherein the input signal is first converted and, during which time, any change in the current carried by a conductor C will be detected and produce a resultant or related indication. Typical cycle times for instrumentation for this type is that the volt meter operates in a conversion mode for a time period of approximately 8 miliseconds and is then held in a stable state for the following 200 miliseconds. While in the stable state, the voltmeter will not respond to any changes in the current carried by the conductor under test. After expiration of the holding period, the volt meter is again automatically activated for a conversion period.

These volt meters provide an end-of-conversion period signal which is utilized in this circuit to activate the stabilizing circuit and connect the capacitor 40 to the stabilizing coil. This signal, as indicated, occurs at the end of the conversion period and represents the optimum time at which the stabilizing signal should be applied to the magnetic core. The reason is that the digital volt meter will thus not be disturbed by the effect of the stabilizing magnetic field induced in the magnet core and will not provide or produce an error signal on that basis. It will also be noted that the stabilizing signal is peferably applied so that the first peak of the magnetic field generated by the damped oscillatory wave-form current is of opposite polarity to the magnetic field generated by the current being measured. Essentially, where a positive current is being measured, the damped stabilizing current is applied so that a negative-going peak is first applied to the coil.

It will be readily apparent from the foregoing description that a novel and particularly advantageous technique has been provided to enhance current measurement by means of clamp-on type probes. Stabilization of the magnetic cores at the time immediately preceding the taking of a reading effectively eliminates the hysteresis effect thus providing extremely good repeatability of results regardless of changes in the measured current. Also, this stabilization technique enables utilization of less expensive materials for fabrication of magnetic cores. This capability of use of less expensive core materials has a further inherent advantage in that such materials usually have relatively higher saturation levels which increases the useful range of the instrument and reduces the air path leakage that would otherwise be introduced if larger air gaps were required to prevent operation in or near the saturation level.

Having thus described this invention, what is claimed is:

1. The method of measuring the current flowing in a workpiece which comprises placing the workpiece inside a magnetic core, continuously inducing a plurality of damped, oscillatory-waveform magnetic fields in said magnetic core at closely spaced intervals so as to maintain the core at all times on an idealized magnetization curve essentially without hysteresis while said workpiece is present therein and current is flowing in the workpiece, and measuring by means of a flux sensor the magnetic field generated by the said current while said workpiece is inside said magnetic core and immediately after at least one of said induced oscillatory magnetic fields has been applied whereby the hysteresis effect present is minimized.

2. The method of claim 1 in which a damped, oscillatory-waveform magnetic field is induced immediately prior to each measurement.

3. The method of claim 1 in which the damped, oscillatory-waveform magnetic fields have a first peak opposite in polarity to the polarity of a magnetic field being sensed.

4. Apparatus for measuring the current flowing in a workpiece which comprises a magnetic field permeable core surrounding a passageway for said workpiece, a magnetic field sensor disposed in electromagnetically coupled relationship to said permeable core for generating an electrical signal output in response to the magnetic flux in the flux path of said core, a magnetic field-producing, stabilizing coil electromagnetically coupled with said core for inducing a magnetic field in said core in response to an electrical current flowing in said coil, means for continuously generating a plurality of damped oscillatory-waveform currents at closely spaced intervals in said coil so as to maintain the core at all times on an idealized magnetization curve essentially without hysteresis including the time that said workpiece is in said passageway and current is flowing therein, and means for measuring between said damped currents said electrical signal output to indicate the current flowing in said workpiece.

5. A probe according to claim 4 wherein said current generating circuit means generates a damped, oscialatory-waveform current inducing magnetic field having a first peak opposite in polarity to the polarity of the magnetic field being measured.

* * * * *